United States Patent
Lee

(10) Patent No.: US 7,365,992 B2
(45) Date of Patent: Apr. 29, 2008

(54) ELECTRONIC CIRCUIT PACKAGE

(75) Inventor: Young-Min Lee, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 11/618,954

(22) Filed: Jan. 2, 2007

(65) Prior Publication Data
US 2007/0153491 A1    Jul. 5, 2007

(30) Foreign Application Priority Data
Jan. 2, 2006    (KR) .................. 10-2006-0000219

(51) Int. Cl.
*H05K 9/00*    (2006.01)
(52) U.S. Cl. .......... 361/800; 361/799; 361/753; 361/816; 361/818; 174/350
(58) Field of Classification Search ............ 361/800, 361/816, 818, 753, 799; 174/350, 32
See application file for complete search history.

(56) References Cited

U.S. PATENT DOCUMENTS

| | | | |
|---|---|---|---|
| 5,159,537 A * | 10/1992 | Okano ................... | 361/816 |
| 5,777,856 A * | 7/1998 | Phillips et al. .......... | 361/816 |
| 5,864,088 A * | 1/1999 | Sato et al. .............. | 174/386 |
| 6,341,063 B2 * | 1/2002 | Kinoshita et al. ....... | 361/690 |
| 6,574,103 B1 * | 6/2003 | Hinterlong .............. | 361/692 |
| 6,590,783 B2 * | 7/2003 | Spratte et al. .......... | 361/800 |
| 6,621,708 B1 * | 9/2003 | Sparkes et al. ......... | 361/752 |
| 6,674,652 B2 * | 1/2004 | Forte et al. ............ | 361/800 |
| 6,972,967 B2 * | 12/2005 | Norte et al. ............ | 361/818 |
| 7,161,092 B2 * | 1/2007 | Glovatsky ............... | 174/522 |
| 7,177,161 B2 * | 2/2007 | Shima ................... | 361/816 |

* cited by examiner

*Primary Examiner*—Diego Gutierrez
*Assistant Examiner*—Dameon E Levi
(74) *Attorney, Agent, or Firm*—Cha & Reiter, LLC

(57) ABSTRACT

An electronic circuit package includes a first electronic module, a second electronic module, and an electric shielding layer. The first electronic module and the second electronic module are bonded in such a way that integrated devices are opposite to each other. The electric shielding layer is inserted between the first electronic module and the second electronic module for ensuring electric insulation between the first electronic module and the second electronic module.

8 Claims, 5 Drawing Sheets

ELECTRONIC CIRCUIT PACKAGE

CLAIM OF PRIORITY

This application claims priority under 35 U.S.C. § 119 to an application entitled "Electronic Circuit Package," filed in the Korean Intellectual Property Office on Jan. 2, 2006 and assigned Serial No. 2006-219, the contents of which are incorporated herein by reference.

BACKGROUND OF THE INVENTION

1. Field of the Invention

The present invention generally relates to an electronic circuit package including a semiconductor electronic circuit, and in particular, to an electronic circuit package having a plurality of different electronic modules integrated therein.

2. Description of the Related Art

With the miniaturization and high integration of portable terminals, there is a demand for the miniaturization of elements for the portable terminals. To meet the demand, elements of various package types have been developed. Among those types, a three-dimensional (3D) System in Package (SiP) type is most widely used.

FIG. 1 illustrates a conventional electronic circuit package 100. The conventional electronic circuit package 100 includes a board 110, a chip set 120 formed on the board 110, and a multi-chip package 130 formed on the chip set 120. The multi-chip package 130 is usually of a Package on Package (POP) type.

However, elements of the 3D SiP type degrade due to the interference of radio-frequency signals, and signal integrity is not ensured. Moreover, a communication module for processing radio-frequency mixed signals experiences error in transmission and reception of a signal due to interference at a transmitter and a receiver.

SUMMARY OF THE INVENTION

The present invention, in one aspect, provides a miniaturized electronic circuit package capable of suppressing the mutual interference between transmission and reception signals, and has a plurality of circuits integrated therein.

There is, in another aspect, provided an electronic circuit package including a first electronic module, a second electronic module, and an electric shielding layer. The first electronic module and the second electronic module are bonded in such a way that integrated devices are opposite to each other. The electric shielding layer is inserted between the first electronic module and the second electronic module for ensuring electric insulation between the first electronic module and the second electronic module.

BRIEF DESCRIPTION OF THE DRAWINGS

The above features and advantages of the present invention will become more apparent from the following detailed description when taken in conjunction with the accompanying drawings in which.

DETAILED DESCRIPTION

For the purposes of clarity and simplicity, detailed description of known functions and configurations incorporated herein is omitted for conciseness and clarity of presentation.

Figure 1:
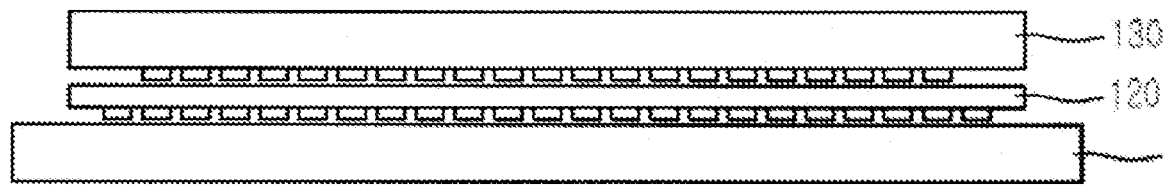
FIG. 1 illustrates a conventional electronic circuit package.
Figure 2:
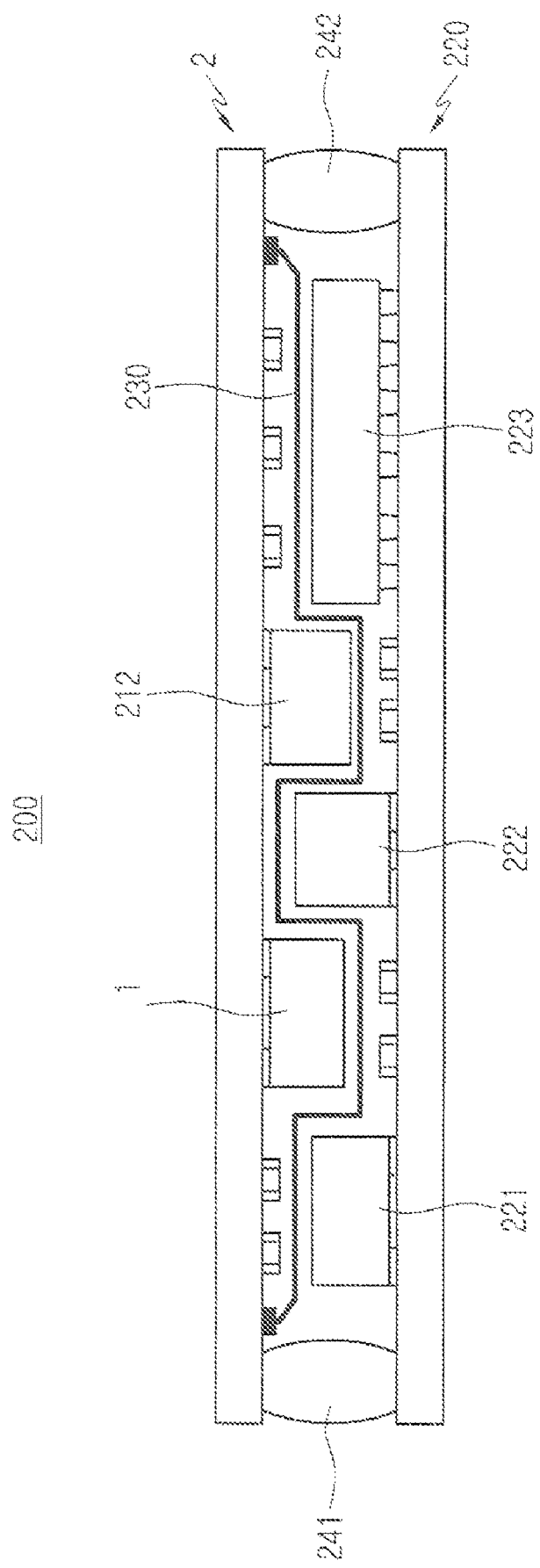
FIG. 2 illustrates an exemplary electronic circuit package according to a first embodiment of the present invention.

FIG. 2 depicts, by way of illustrative and non-limitative example, an electronic circuit package 200 according to a first embodiment of the present invention.

The electronic circuit package 200 includes a first electronic module 210 and a second electronic module 220 that are bonded preferably in such a way that integrated devices 211, 212 and integrated devices 221, 222 are opposite to each other. An electric shielding layer 230 is inserted between the first electronic module 210 and the second electronic module 220 for ensuring electric insulation between the first electronic module 210 and the second electronic module 220. In a preferred embodiment, a signal connection pin 241 and a grounding pin 242 are respectively disposed at opposite ends of the package 200.

The electric shielding layer 230 may be a magnetic shielding ground plane. The layer 230 prevents mutual interference between Radio-Frequency (RF) signals in the integration of electronic modules using different RF signals, thereby allowing the implementation of a 3D electronic circuit package having high-integration and low-profile modules integrated therein.

The signal connection pin 241 is inserted between adjacent ends of the first electronic module 210 and the second electronic module 220 to electrically connect the first electronic module 210 and the second electronic module 220. More than one signal connection pin may be used. The grounding pin 242 is inserted between the other adjacent ends of the first electronic module 210 and the second electronic module 220 to form the electric ground of the first electronic module 210 and the second electronic module 220. The signal connection pin 241 and the grounding pin 242 may be formed using solder balls.

Figure 3:
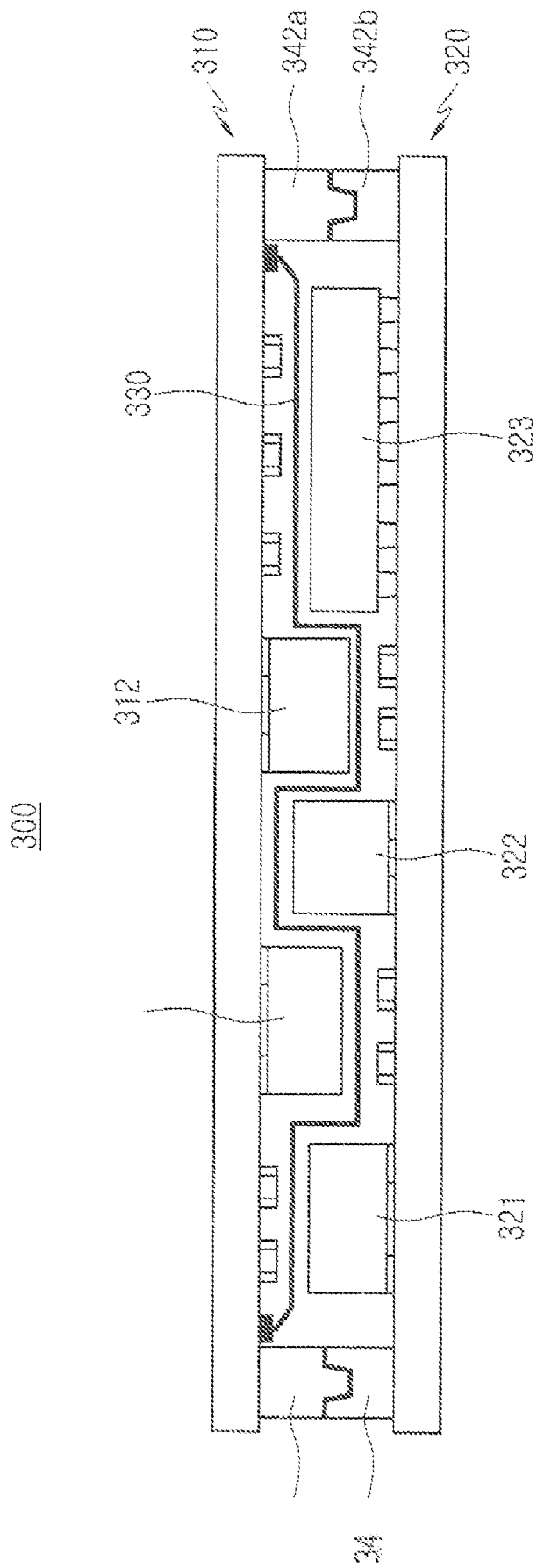
FIG. 3 illustrates a possible realization of an electronic circuit package according to a second embodiment of the present invention.

FIG. 3 illustrates an exemplary electronic circuit package 300 according to a second embodiment of the present invention The electronic circuit package 300 includes a first electronic module 310 and a second electronic module 320 that are bonded preferably in such a way that integrated devices 311, 312 and integrated devices 321, 322 are opposite to each other. An electric shielding layer 330 is inserted between the first electronic module 310 and the second electronic module 320 for ensuring electric insulation between the first electronic module 310 and the second electronic module 320. In a preferred embodiment, signal connection pins 341a, 341b and grounding pins 342a, 342b are respectively disposed at opposite ends of the package 300.

The signal connection pins 341a, 341b are inserted between adjacent ends of the first electronic module 310 and the second electronic module 320 to electrically connect the first electronic module 310 and the second electronic module 320. More than one signal connection pin may be used. The grounding pins 342a, 342b are inserted between the other adjacent ends of the first electronic module 310 and the second electronic module 320 to form the electric ground of the first electronic module 310 and the second electronic module 320. Micro sockets may be used as the signal connection pins 341a, 341b and the grounding pins 342a and 342b.

Figure 4:
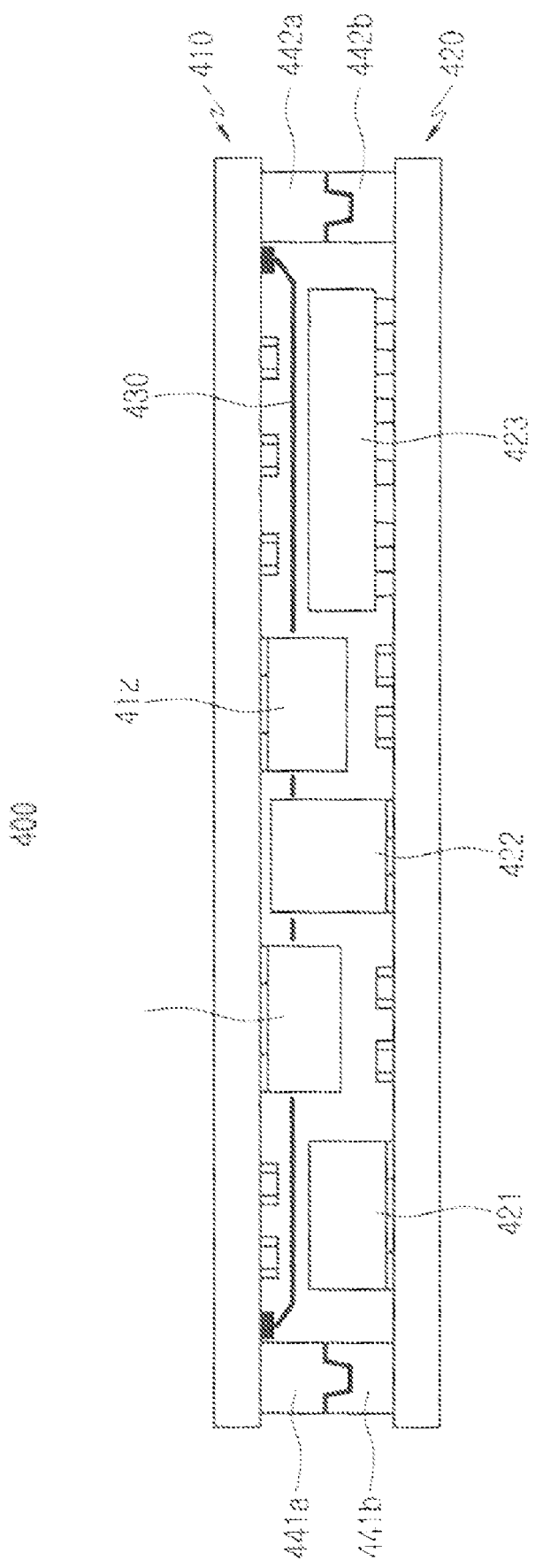
FIG. 4 illustrates an example of an electronic circuit package according to a third embodiment of the present invention.

FIG. 4 illustrates an example of an electronic circuit package 400 according to a third embodiment of the present invention. The electronic circuit package 400 includes a first electronic module 410 and a second electronic module 420 that are bonded preferably in such a way that integrated devices 411, 412 and integrated devices 421 422 are opposite to each other. An electric shielding layer 430 is inserted between the first electronic module 410 and the second electronic module 420 for ensuring electric insulation between the first electronic module 410 and the second electronic module 420. In a preferred embodiment, signal connection pins 441a, 441b and grounding pins 442a, 442b are respectively disposed at opposite ends of the package 400. Micro sockets may be used as the signal connection pins 341a, 341b and the grounding pins 342a, 342b.

The electric shielding layer 430 may be in a form that shields the remaining devices 421 and 423 except for some devices 411, 412, and 422. Note that devices 223 and 323 perform similar functions.

Figure 5:
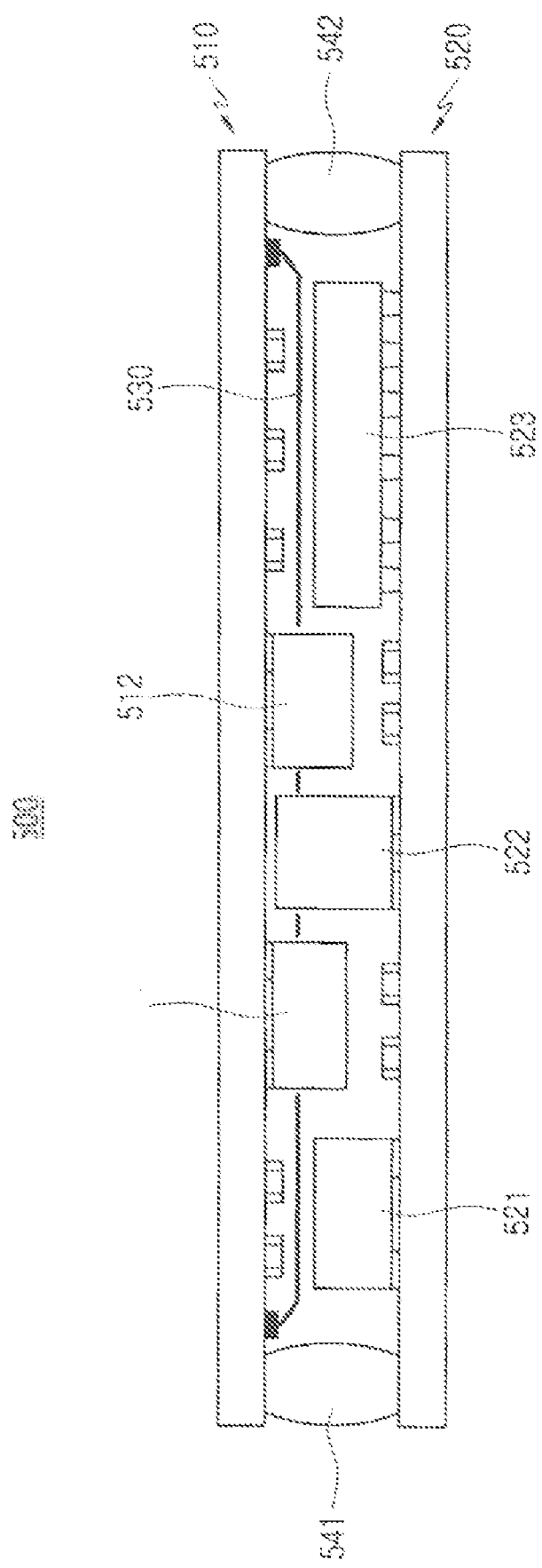
FIG. 5 illustrates an implementation of an electronic circuit package according to a fourth embodiment of the present invention.

FIG. 5 illustrates an electronic circuit package 500 according to a fourth embodiment of the present invention. The electronic circuit package 500 includes a first electronic module 510 and a second electronic module 520 that are bonded preferably in such a way that integrated devices 511, 512 and integrated devices 521, 522 are opposite to each other. An electric shielding layer 530 is inserted between the first electronic module 510 and the second electronic module 520 for ensuring electric insulation between the first electronic module 510 and the second electronic module 520. In a preferred embodiment, a signal connection pin 541 and a grounding pin 542 are respectively disposed at opposite ends of the package 500. The signal connection pin 541 and the grounding pin 542 may be formed using solder balls.

The electric shielding layer 530 may be in a form that shields the remaining devices 521 and 523 except for some devices 511, 512, and 522.

The present invention can be applied to elements such as a sub-module board, an RF element, a passive device, and a digital integrated circuit that are likely to have signal interference in the above-shown embodiments, the bonding may be such that the devices mesh interleavingly. This results in a zig-zag cross-section for the electric shielding layer 230, 330, in the first two embodiments.

According to the present invention, electronic modules are arranged such that modules having devices integrated therein are disposed opposite to each other so that they face each other. An electric shielding layer is formed between the electronic modules, thereby suppressing the interference of RF signals. Therefore, the present invention can be applied to a high-integration/high-performance RF electronic circuit package using RF mixed signals.

While the present invention has been shown and described with reference to preferred embodiments thereof, it will be understood by those skilled in the art that various changes in form and details may be made therein without departing from the spirit and scope of the invention.

What is claimed is:

1. An electronic circuit package comprising:
   a first electronic module and a second electronic module that are bonded such that integrated devices are opposite to each other; and
   an electric shielding layer arranged between the first electronic module and the second electronic module for providing electric insulation between only some predetermined integrated devices of the first electronic module and the second electronic module and permitting other integrated devices to extend through the shielding layer;
      wherein respective ends of the first and second electronic modules are adjacent, said package further comprising:
   at least two signal connection pins that are inserted between one adjacent pair of the respective ends of the first and second electronic modules to electrically connect the first electronic module and the second electronic module; and
   a grounding pin that is inserted between another adjacent pair of the respective ends of the first and second electronic modules to form the electric ground of the first electronic module and the second electronic module.

2. The electronic circuit package of claim 1, wherein the signal connection pins and the grounding pin are formed using solder balls.

3. The electronic circuit package of claim 1, wherein, for the signal connection pins and the grounding pin, one or more of them is implemented as a micro socket.

4. The electronic circuit package of claim 1, wherein the signal connection pins and the grounding pin are implemented as a micro sockets.

5. The electronic circuit package of claim 1, wherein said one and said another adjacent pair collectively make up said respective ends.

6. The electronic circuit package of claim 1, wherein said one adjacent pair is disposed opposite to said another adjacent pair.

7. The electronic circuit package of claim 6, wherein said one and said another adjacent pair collectively make up said respective ends.

8. The electronic circuit package of claim 1, wherein the bonding is such that the integrated devices mesh interleavingly.

* * * * *